(12) United States Patent
Fraas et al.

(10) Patent No.: US 6,337,437 B1
(45) Date of Patent: Jan. 8, 2002

(54) ELECTRIC POWER GENERATING LANTERN USING FORCED AIR COOLED LOW BANDGAP PHOTOVOLTAIC CELLS

(75) Inventors: Lewis M. Fraas, Issaquah; Douglas J. Williams, Tacoma; Paul D. Custard, Puyallup, all of WA (US)

(73) Assignee: JX Crystals Inc., Issaquah, WA (US)

( * ) Notice: Subject to any disclaimer, the term of this patent is extended or adjusted under 35 U.S.C. 154(b) by 0 days.

(21) Appl. No.: 08/724,833

(22) Filed: Oct. 3, 1996

(51) Int. Cl.$^7$ .............................................. H01L 31/00

(52) U.S. Cl. ....................... 136/253; 136/259

(58) Field of Search .................. 136/253, 259

(56) References Cited

U.S. PATENT DOCUMENTS

| | | | |
|---|---|---|---|
| 3,433,676 A | 3/1969 | Stein | 136/89 |
| 3,751,303 A | 8/1973 | Kittl | 136/89 |
| 4,234,352 A | 11/1980 | Swanson | 136/253 |
| 4,707,560 A | 11/1987 | Hottel et al. | 136/253 |
| 4,776,895 A | 10/1988 | Goldstein | 136/253 |
| 4,906,178 A | 3/1990 | Goldstein et al. | 431/79 |
| 4,976,606 A | 12/1990 | Nelson | 431/79 |
| 5,312,521 A | 5/1994 | Fraas et al. | 136/253 |
| 5,356,487 A | 10/1994 | Goldstein et al. | 136/253 |
| 5,383,976 A | 1/1995 | Fraas et al. | 136/253 |
| 5,389,158 A | 2/1995 | Fraas et al. | 136/244 |
| 5,401,329 A | 3/1995 | Fraas et al. | 136/253 |
| 5,403,405 A | 4/1995 | Fraas et al. | 136/253 |
| 5,439,532 A | 8/1995 | Fraas | 136/253 |
| 5,512,108 A | * 4/1996 | Noreen | 136/253 |
| 5,512,109 A | 4/1996 | Fraas et al. | 136/253 |
| 5,551,992 A | 9/1996 | Fraas | 136/253 |
| 5,560,783 A | 10/1996 | Hamlen | 136/253 |

OTHER PUBLICATIONS

H.A. Macleod, "Thin–Film Optical Filters", McGraw–Hill Publishing Company, pp. 499–502 (1989).
Hofler et al., "Selective Emitters for Thermophotovoltaic Solar Energy Conversion", Solar Cells, vol. 10, pp. 257–271 (Dec. 1983).

* cited by examiner

Primary Examiner—Mark Chapman
(74) Attorney, Agent, or Firm—James Creigton Wray; Meera P. Narasimhan

(57) ABSTRACT

A compact forced air cooled thermophotovoltaic generator includes a TPV converter assembly, a fan which is driven by electric power generated by the converter assembly and a housing for enclosing the assembly and fan. The assembly includes a fuel/air mixing tube, an infrared emitter positioned in the combustion chamber, a receiver positioned around the emitter and a heat shield positioned between the receiver and the emitter. The receiver includes a circuit having TPV cells connected to an inner surface and radial fins extending from an outer surface. A fuel source may be provided proximate (i.e. beneath) the mixing tube or may be remotely connected to the mixing tube by a fuel line. A housing encloses the TPV converter assembly and the fuel source, if provided as part of the unit. A fan or other updraft mechanism electrically connected to the cell circuit is provided at the bottom of the housing beneath the fuel source and/or converter assembly. The fan blows air upward around the fuel cylinder and mixing tube, along the walls of the housing and past the radial fins of the heat sink, thereby dramatically improving cell cooling and increasing combustion air flow. A chimney and exhaust duct may be provided for carrying exhaust gases generated by the combustion away from the generator. Various features may be added, depending on the intended use of the generator. For portable applications, handles or other carrying means are included on the housing. For stationary applications, wall mounts or plates are provided. Preferably, the housing of the present generator has a construction that provides easy access for replacing depleted fuel sources.

49 Claims, 2 Drawing Sheets

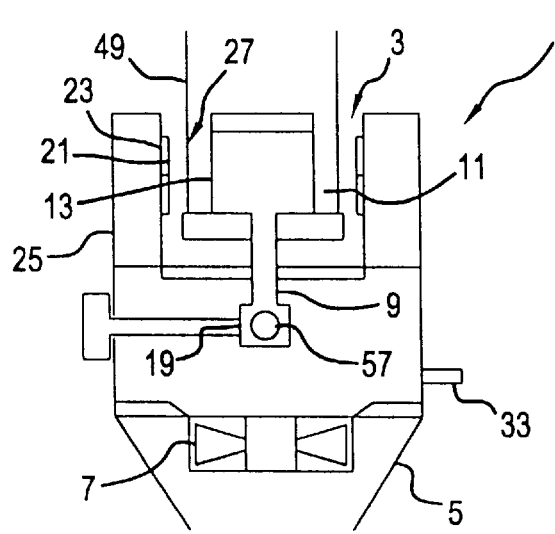
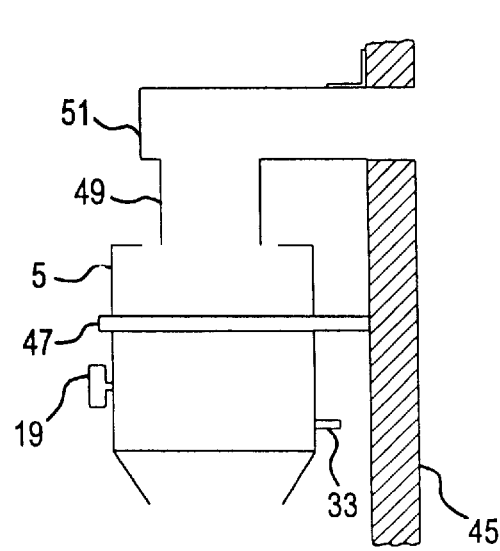
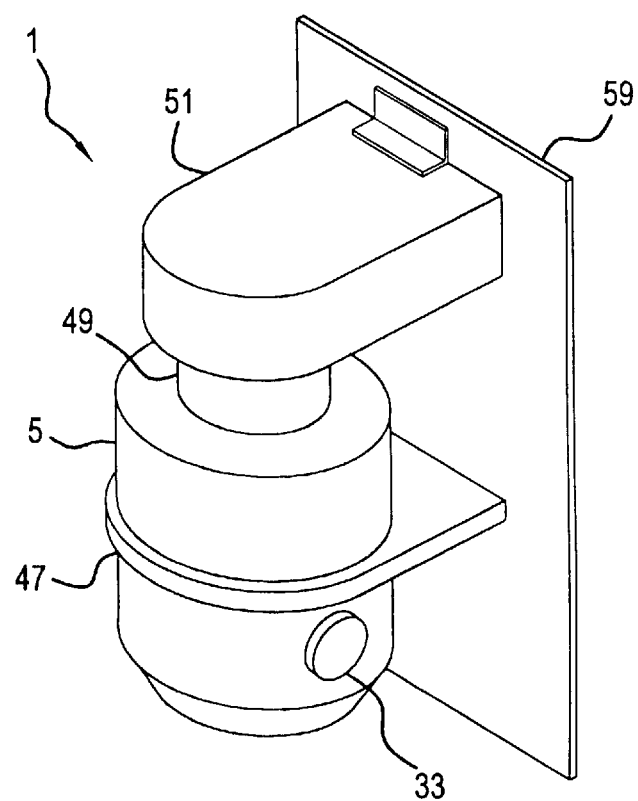

ELECTRIC POWER GENERATING LANTERN USING FORCED AIR COOLED LOW BANDGAP PHOTOVOLTAIC CELLS

BACKGROUND OF THE INVENTION

The present invention relates to thermophotovoltaic (TPV) power generators which convert infrared radiant energy to electric power using low bandgap photovoltaic cells.

An earlier filed copending application Ser. No. 08/702,184, now U.S. Pat. No. 5,865,906 disclosed a TPV generator including a platinum wire coil inserted in the flame of a burner and surrounded by a circuit of low bandgap TPV cells. In that unit, the heated coil glows and emits infrared energy. That infrared energy is received by the TPV cells and converted to electric power. Excess heat from the TPV cells is removed by convective air cooling through fins attached to the outside surface of the cell circuit. Variations of that basic small TPV generator include units having ceramic emitters with infrared emission spectrums matched to the TPV cells in place of the platinum wire coil.

An example of the units described in the earlier filed application have the following dimensions. An emitter has a diameter of about 0.5 inches and a height of about 1.5 inches. A 6 volt TPV circuit includes 24 cells and has a diameter of about 2 inches and a height of about 1.5 inches. The cell circuit is cooled by 24 radial fins. Each fin is about 3 inches tall and 2 inches long from tip to base. In the example, the complete TPV converter assembly is about 6 inches in diameter and three inches tall, not including the height of the fuel/air mixing tube. Generators made according to those specifications typically generate about 2 watts of electric power with a steady state cell operating temperature of 90 degrees Celsius.

Needs exist for TPV generators having increased power output while maintaining compact package sizes. Needs further exist for economically viable TPV cell generators having increased power per cell. Needs further exist for compact TPV generating units that are easily adaptable for use in a variety of potential applications.

SUMMARY OF THE INVENTION

The present invention is a compact electric power generating unit that provides for high power outputs. The unit includes a basic TPV converter assembly and a fan for improving cell cooling. The assembly includes a fuel/air mixing tube, an infrared emitter, a TPV cell circuit surrounding the emitter, cooling fins extending from the cell circuit and a cylinder enclosing the tube, emitter, cell circuit and cooling fins. A fan is positioned at a bottom of the cylinder for forced air cooling. When the fuel valve of the mixing tube is opened, the fuel/air mixture is ignited at the top of the cylinder. The resulting combustion heats the emitter. The heated emitter emits infrared radiation, which impinges on the TPV cells of the cell circuit and is converted to electric power. A portion or all of the generated electric power is delivered from the circuit to the fan. The fan, equipped with the constant power supply from the cell circuit, blows air upward past the cooling fins, thereby greatly improving cell cooling. Excess electric power converted by the cell circuit may be distributed for other useful purposes.

Relative to a TPV generator using only convective cooling, the present generator unit allows cooling fin length from tip to base to be halved and fin density to be quadrupled, such that about ten times more waste heat is removed. That allows for the production of ten times more electric power while not increasing the diameter of the unit beyond the dimensions of a unit with convective cooling. For example, for a 6 inch diameter generator, fin length in the present unit decreases from 2 inches to one inch, thereby allowing the cell circuit diameter to be increased from 2 inches to 4 inches. By doubling the circuit diameter, twice as many cells may be included in the circuit, thereby doubling the output voltage from 6 volts to 12 volts. Also, the emitter diameter of the present unit may be increased from 0.5 inch to 2.5 inches, providing for a five fold increase in emitter area and emitter power for a given emitter temperature.

The fan of the present unit provides benefits beyond enhanced cell cooling. As the fuel/air mixing tube is contained in the cylinder, the fan provides for an increase in combustion air flow, which in turn allows for an increase in fuel flow and results in increased emitter temperature. By increasing the emitter temperature, substantial increase in output electric power is realized.

The example of the present unit, including the TPV assembly, the cylinder and the fan at the base of the cylinder, provides for electric power outputs in the range of 20 watts. The fan itself consumes minimal electric power, in the range of 1 watt.

While the present forced air cooled TPV generator has a wide range of possible embodiments and applications, three preferred embodiments are immediately useful.

In one preferred embodiment, a fuel cylinder is located in the cylindrical enclosure beneath the fuel/air mixing tube and above the fan. The diameter of the fuel cylinder is preferably significantly less than the enclosure diameter, such that air from the fan passes upward around the fuel cylinder and past the fins for cell cooling. A handle is provided on the cylindrical enclosure for rendering the TPV generator easily portable. In a 20 watt version of that TPV generator including one pound of fuel, the approximate dimensions of the unit are 6 inches in diameter and 12 inches in height.

In a second preferred embodiment of the present invention, the TPV generator is secured to the inner surface of an exterior wall by a mounting bracket. A fused silica (glass) shield surrounds the emitter assembly and extends upward. The shield functions as a chimney and leads to a small exhaust hood which routes exhaust gases outward through an opening in the exterior wall. The small exhaust hood, which is preferably approximately 2 inches high and 4.5 inches wide, is hinged at its top to the wall, thereby allowing the hood to be easily lifted for igniting the generator.

A third preferred embodiment of the present generator is configured for use in recreational vehicles, sailboats, mountain cabins and other small living spaces where a large fuel (e.g., propane) cylinder is already present. A fuel line from the fuel source leads directly to the fuel/air mixing tube, thereby eliminating the need for housing a fuel cylinder in the generator enclosure. Other features, including a wall mount, chimney and exhaust hood may also be included. The removal of the fuel cylinder from inside the enclosure renders the TPV generator much more compact. The resultant wall mounted TPV generator is preferably only about 12 inches high from the bottom of the fan to the tip of the exhaust hood. That embodiment generates heat and light in addition to 20 watts of electric power and is easy to install.

In any of the embodiments the chimney and exhaust hood may be configured to remove only the combustion exhaust. In those cases the blown air that cools the fins, heats the enclosure. The blown air also circulates over the exhaust hood, transferring heat from the hood to the room. In embodiments where it is desired not to add heat to the room, the exhaust hood also conducts the blown air out of the room.

A thermophotovoltaic generator apparatus includes a thermophotovoltaic converter assembly, a fan positioned for generating an updraft from beneath the assembly, and a housing for enclosing the fan and the assembly. The assembly preferably includes a fuel source, a fuel/air combustion chamber connected to the fuel source for allowing hydrocarbon combustion. An infrared emitter in the combustion chamber emits infrared radiation when heated by combustion gases resulting from the hydrocarbon combustion in the combustion chamber. A receiver positioned around the infrared emitter receives the infrared radiation and converts the radiation to electric power. A heat shield positioned between the receiver and the infrared emitter prevents exhaust gases from contacting the receiver. The infrared emitter is preferably perforated, and the heat shield is preferably a fused silica heat shield that is transparent to infrared energy. The receiver includes a circuit having an inner surface facing the emitter and an outer surface, thermophotovoltaic cells connected to the inner surface of the circuit, and heat sinks connected to the outer surface of the circuit. The heat sinks preferably have radial, vertical fins. An infrared selective filter may be positioned between the heat shield and the receiver. The fan blows air across the fins and sinks.

The fuel source is preferably a fuel cylinder enclosed by the housing and carrying a hydrocarbon fuel. A valve is positioned between the fuel source and the mixing tube for regulating the flow of fuel into the combustion chamber. The fuel source is preferably selected from the group consisting of a propane fuel source and a butane fuel source. The fan blows air along the fuel cylinder and then over the heat sink and fins.

The combustion chamber of the converter assembly preferably includes a fuel/air mixing tube having a lower end for receiving fuel from the fuel source and an upper end for housing combustion. The mixing tube has a cylindrical body with multiple combustion air inlet holes. In preferred embodiments, the mixing tube has a combustion region positioned at a top end of the cylindrical body, the combustion region defined by side walls of the emitter and ceramic top and bottom discs extending between the emitter side walls. The fan blows air into the air inlet holes as well as over the heat sink and fins, increasing combustion air.

An electric conduit carrying wires routing at least a portion of the generated electric power from the receiver to the fan extends at least partially between the receiver and the fan. Electric power may be further routed via the electric conduit to an electric power outlet. The electric conduit preferably includes a slip connector for facilitating disconnect and reconnect of electrical connections extending between the receiver and the fan.

In preferred embodiments of the present apparatus, the housing takes the shape of the receiver. In preferred embodiments, the housing has generally cylindrical side walls, an open top and air draw ducts positioned in the side walls at a lower end of the housing. The housing may be divided into upper and lower sections. The upper section is removably connected to the lower section by connectors, such as latches. The upper section may also be rotatably connected to the lower section by hinges. Preferably, the lower section houses the fan and the fuel source and the upper section houses the combustion chamber, the emitter, the heat shield and the receiver.

For portable embodiments of the generator a handle extending from an outer surface of the housing is provided.

For wall mounted embodiments of the generator a bracket connectable to outer walls of the housing for connecting the apparatus to a surface is provided. In preferred wall mounted embodiments, the heat shield includes an exit end which extends beyond an upper edge of the housing. An exhaust hood is positioned at the exit end of the heat shield for directing exhaust gases away from the converter assembly. The hood is preferably hinged to an exterior surface for providing access to a cavity defined by walls of the heat shield. The fan blows air across the heat sink and fins, with the warmed air either returning to the room or exiting via the exhaust hood.

In another preferred embodiment of the present invention the generator includes a thermophotovoltaic converter assembly, a remote fuel source connected to the assembly by a fuel line, a fan positioned for generating an updraft from beneath the assembly, and a housing for enclosing the fan and the assembly. A mounting bracket is connected to the housing for mounting the housing, fan and assembly on a wall. In one preferred embodiment a plate is connected to the exhaust hood and the mounting bracket for mounting the housing, assembly, fan, exhaust hood and mounting bracket as a single unit on a surface. The fuel source may be any acceptable fuel source, including a propane fuel source or a natural gas fuel source. The fan blows air between the housing and heat sink and over or into the hood and into or out of the room.

A thermophotovoltaic generator method includes the step of providing a thermophotovoltaic converter assembly including a combustion chamber, an emitter positioned proximate the combustion chamber, a receiver positioned around the emitter and a heat shield positioned between the emitter and the receiver, combusting a fuel/air mixture in the combustion chamber. A housing is positioned around the assembly such that the housing encloses at least substantially all of the assembly. The emitter is heated using exhaust gases resulting from combustion of the fuel/air mixture to produce infrared energy. The emitted infrared energy is collected by the receiver and converted to electric power. An updraft flow is created from beneath the assembly for cooling the receiver and for providing an increased combustion air flow. Preferably, generated electric power is routed from the receiver to the fan for powering the fan. The fuel source may be provided in the housing directly beneath the assembly or may be remotely connected to the assembly by a fuel line. Exhaust gases are preferably directed away from the combustion chamber via a passage defined by the heat shield and exhaust hood. The entire generating apparatus may be mounted on a wall.

These and further and other objects and features of the invention are apparent in the disclosure, which includes the above and ongoing written specification, with the claims and the drawings.

BRIEF DESCRIPTION OF THE DRAWINGS

FIG. 5 is a partial vertical cross-section showing a generator having an external fuel source.

FIG. 6 shows the generator of FIG. 5 mounted on a wall.

FIG. 7 is a perspective view of the wall mounted generator of FIG. 6.

DETAILED DESCRIPTION OF THE PREFERRED EMBODIMENTS

Figure 1:
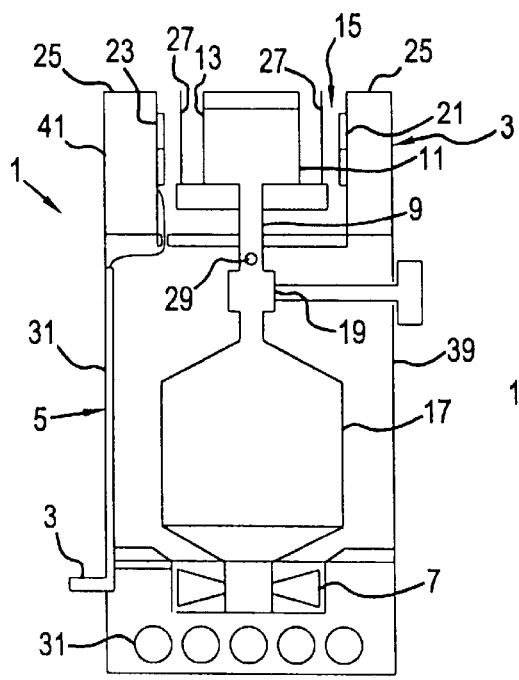
FIG. 1 is a partial vertical cross-section showing the TPV generator.
Figure 2:
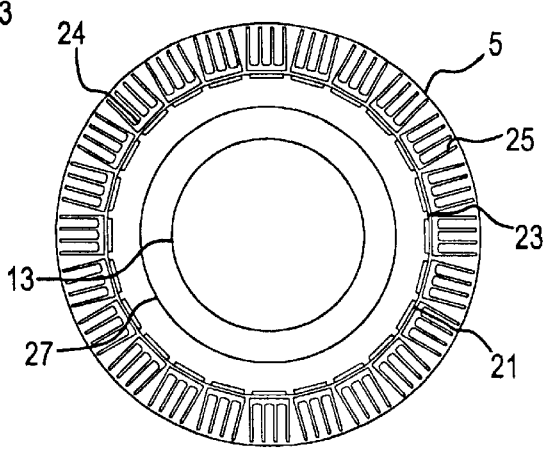
FIG. 2 is a partial horizontal cross-section showing the TPV generator.

Referring generally to FIGS. 1 and 2, the present invention is a compact thermophotovoltaic electric power generator 1 that includes a TPV converter assembly 3, a housing 5 canister or other enclosure and a fan 7 or other updraft mechanism. The converter assembly 3 includes a fuel/air mixing tube 9 having a combustion chamber 11 for generating a hydrocarbon flame, an emitter 13 positioned in the combustion chamber 11 for emitting infrared radiation when heated by the combustion gases, and a receiver 15 positioned around the emitter 13 for receiving the infrared radiation and for converting the infrared radiation to electric power. The mixing tube 9 is connected to a fuel source 17 which may be a part of or separate from the assembly 3. A valve 19 is preferably provided for regulating the flow of fuel. When the fuel/air mixture in the tube 9 is ignited, a flame is produced for heating the emitter 13. The emitter 13 may be any suitable emitter and preferably includes perforations. The receiver 15 preferably includes an array of thermophotovoltaic cells 21 bonded to a circuit 23. The cells 21 and circuit 23 are cooled by heat sinks including a backing 24 and radial fins 25 extending from the backing 24. A heat shield 27 is preferably positioned between the TPV cells 21 of the receiver 15 and the infrared emitter 13. The heat shield 27 is transparent to the infrared energy that is convertible by the TPV cells 21.

The entire TPV converter assembly 3 is preferably enclosed by a housing 5. A fan 7 or other device for creating an upward draft is positioned at the base of the housing 5.

In a preferred embodiment of the present generator 1, the receiver 15 forms a generally cylindrical ring around the emitter 13, the heat shield 27 is generally cylindrical, and the housing 5 is a generally cylindrical structure that encloses the entire TPV converter assembly 3 and the updraft mechanisms 7.

FIGS. 1 and 2 show a TPV canister embodiment of the present generator 1. A hydrocarbon fuel source 17, such as a propane or butane fuel cylinder, is situated inside the housing canister 5. In operation, when the fuel valve 19 at a top of the source 17 is opened, a fuel jet enters the vertical fuel/air mixing tube 9 through a pin hole. Initially, the fuel jet aspirates or entrains combustion air through combustion air inlet holes 29 located on sides of the fuel/air mixing tube 9. The fuel/air mixture rises and burns inside a combustion chamber 11 located at a top region of the mixing tube 9. The combustion chamber 11 is enclosed by ceramic top and bottom discs and an infrared emitter 13. Preferably, the emitter 13 is a cylindrical perforated infrared emitter. The emitter 13 is heated by the combustion by-product gases which escape outward through the emitter perforations. A heat shield 27, preferably a fused silica heat shield, surrounds the emitter 13 and prevents hot gases from contacting the TPV cells 21 of the receiver 15. The TPV cells 21 receive infrared energy from the emitter 13 and convert a fraction of that energy to electric power. The TPV cells 21 are mounted on a circuit 23. Radial fins 25 extending from a heat sink backing 24 connected to the circuit 23 cool the circuit 23 and cells 21. Electric power from the cell circuit 23 is routed, preferably via an electric conduit 31, to an electric power outlet 33 and to the fan 7 mounted below the fuel source 17. As the emitter 13 begins to glow, the fan 7 begins to operate, blowing cooling air up inside the walls of the housing 5 past the fins 25. Operation of the fan 7 also increases the combustion air supply, which allows increased fuel flow, a brighter emitter and ultimately a increased electric power output. The housing 5, which preferably encloses the entire TPV converter assembly 3 and the fan 7, preferably includes air draw ducts 37 along its lower edges.

For economic efficiency, fuel cylinders 17 should be easily replaced, just as batteries are easily replaced in flashlights. Any suitable means for providing quick and easy access to the fuel cylinder 17 is acceptable. In preferred embodiments, the housing 5 includes a lower section 39 and an upper section 41 detachably or hingedly connected to the lower section 39. That allows for the fuel cylinders 17 to be replaced. In one embodiment, the upper section 41 and lower section 39 meet just below the fuel regulating valve 19. Preferably, a slip connector 43 is provided for facilitating electrical disconnect and reconnect of the lines leading from the cell circuit 23 to the fan 7 and electrical power output 33.

FIG. 2 is a top view of the TPV canister 1. As shown in FIG. 2, the housing 5 completely encloses the emitter 13, the heat shield 27 and the TPV cells 21, circuit 23 and cooling fins 25 of the receiver 15.

Figure 3:
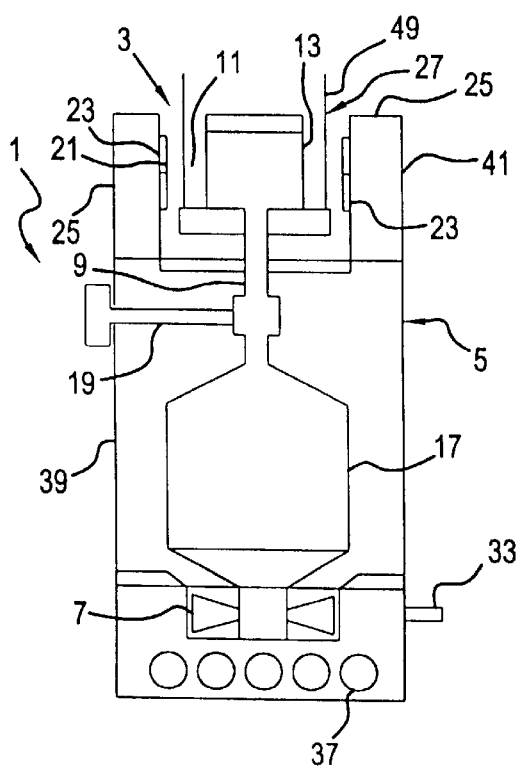
FIG. 3 is a partial vertical cross-section showing a preferred embodiment of the present generator including a chimney.
Figure 4:
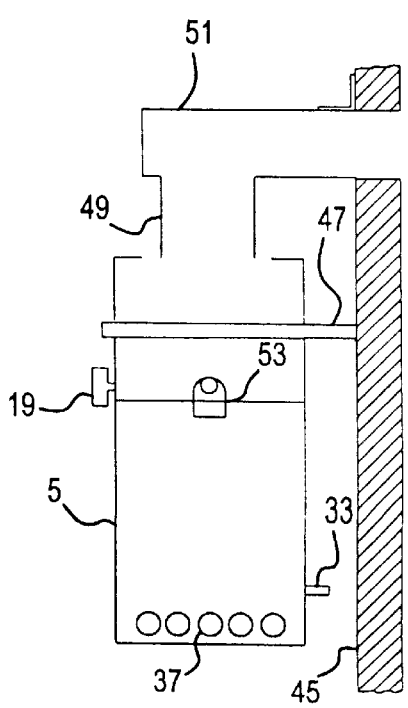
FIG. 4 is a side view of a wall mounted embodiment of the present generator including a support bracket, a small hinged exhaust hood and a chimney.

FIGS. 3 and 4 show a wall mounted variation of the TPV canister embodiment of FIGS. 1 and 2. The generator 1, which includes the TPV converter assembly 3, the fan 7 and the housing 5, is mounted to an inner surface of an exterior wall 45 by a mounting bracket 47 or other acceptable mounting means. The fused silica heat shield 27 surrounding the emitter 13 extends beyond the walls of the housing 5 and proceeds upward to create a transparent chimney 49. The chimney 49 feeds exhaust gases from the combustion chamber 11 of the mixing tube 9 into a small exhaust hood 51. In preferred embodiments, the hood 51 is hinged or otherwise movably connected to the wall 45 or chimney 49 to allow operators to ignite the fuel/air mixture in the mixing tube 9.

As shown in FIG. 4, the housing 5 preferably includes an upper section 41 detachably connected to a lower section 39. The lower section 39 is connected to the upper section 41 by latches 53. The latches 53 are easily disconnected and reconnected to allow for fuel cylinder replacement. Any other suitable connector is also possible.

FIGS. 5–7 show another preferred embodiment of the present invention 1 known as the wall mounted TPV lantern. The lantern includes a housing 5, a fan 7 positioned at a bottom of the housing 5 and a TPV converter assembly 3. No fuel cylinder or other fuel source is provided between the housing walls. Fuel is supplied to the mixing tube 9 through a fuel line 57 which enters from the side of the housing 5. A valve 19 regulates fuel flow. Operation of the lantern embodiment is similar to the operation of the embodiments described above. The generator 1, which includes the TPV converter assembly 3, the fan 7 and the housing 5, is mounted to an inner surface of an exterior wall 45 by a mounting bracket 47 or other acceptable mounting means. The fused silica heat shield 27 surrounding the emitter 13 extends beyond the walls of the housing 5 and proceeds upward to create a transparent chimney 49. The chimney 49 feeds exhaust gases from the combustion chamber 11 of the mixing tube 9 into a small exhaust hood 51.

As shown in FIG. 7, the converter assembly 3, housing 5, fan 7, chimney 49 and exhaust hood 51 are preferably mounted on a plate 59 that can be easily and safely attached to a wall 45. For installation of the lantern/chimney/exhaust hood unit, a venting orifice is drilled through the wall. A metal liner having an outside grille is positioned in the hole. The plate may then be affixed to the wall using any suitable means, such that the exhaust gases are directed from the chimney 49, through the hood 51 and out of the venting orifice in the wall 45.

While the invention has been described with reference to specific embodiments, modifications and variations of the invention may be constructed without departing from the scope of the invention, which is defined in the following claims.

We claim:

1. A thermophotovoltaic generator apparatus comprising a thermophotovoltaic converter assembly, a fan positioned for generating an updraft from beneath the assembly, and a housing for enclosing the fan and the assembly, wherein the assembly comprises a fuel source, a fuel/air combustion chamber connected to the fuel source for allowing hydrocarbon combustion, an infrared emitter positioned in the combustion chamber for emitting infrared radiation when heated by combustion gases resulting from the hydrocarbon combustion in the combustion chamber, a receiver positioned around the infrared emitter for receiving the infrared radiation and for converting the radiation to electric power, and a heat shield positioned between the receiver and the infrared emitter for preventing exhaust gases from contacting the receiver.

2. The apparatus of claim 1, wherein the receiver further comprises a circuit having an inner surface facing the emitter and an outer surface, thermophotovoltaic cells connected to the inner surface of the circuit, and heat sinks connected to the outer surface of the circuit.

3. The apparatus of claim 2, wherein the heat sinks further comprise a backing connected to the circuit and radial fins extending from the backing.

4. The apparatus of claim 1, wherein the fuel source further comprises a fuel cylinder for holding a hydrocarbon fuel.

5. The apparatus of claim 4, further comprising a valve positioned between the fuel source and the mixing tube for regulating the flow of fuel into the mixing tube.

6. The apparatus of claim 1, wherein the fuel source is selected from the group consisting of a propane fuel source and a butane fuel source.

7. The apparatus of claim 1, wherein the infrared emitter is perforated.

8. The apparatus of claim 1, wherein the heat shield is a fused silica heat shield that is transparent to infrared energy.

9. The apparatus of claim 1, wherein the combustion chamber further comprises a fuel/air mixing tube having a lower end for receiving fuel from the fuel source and an upper end for housing combustion.

10. The apparatus of claim 9, wherein the mixing tube further comprises a cylindrical body having combustion air inlet holes.

11. The apparatus of claim 10, wherein the tube further comprises a combustion region positioned at a top end of the cylindrical body, and wherein the combustion region is defined by side walls of the emitter and ceramic top and bottom discs extending between the emitter side walls.

12. The apparatus of claim 1, further comprising an infrared selective filter positioned between the heat shield and the receiver.

13. The apparatus of claim 1, further comprising an electric conduit extending between the receiver and the fan for carrying wires routing at least a portion of the generated electric power from the receiver to the fan.

14. The apparatus of claim 13, wherein generated electric power is further routed via the electric conduit to an electric power outlet.

15. The apparatus of claim 13, wherein the electric conduit further comprises a slip connector for facilitating disconnect and reconnect of electrical connections extending between the receiver and the fan.

16. The apparatus of claim 1, wherein the housing has generally cylindrical side walls, an open top and air draw ducts positioned in the side walls at a lower end of the housing.

17. The apparatus of claim 1, wherein the housing further comprises a lower section and an upper section movably connected to the lower section.

18. The apparatus of claim 17, wherein the upper section is removably connected to the lower section by connectors.

19. The apparatus of claim 18, wherein the connectors are latches.

20. The apparatus of claim 17, wherein the upper section is rotatably connected to the lower section by hinges.

21. The apparatus of claim 17, wherein the lower section houses the fan and the fuel source and wherein the upper section houses the combustion chamber, the emitter, the heat shield and the receiver.

22. The apparatus of claim 1, further comprising a handle extending from an outer surface of the housing.

23. The apparatus of claim 1, further comprising a mounting bracket connectable to outer walls of the housing for connecting the apparatus to a surface.

24. The apparatus of claim 1, wherein the heat shield comprises an exit end which extends beyond an upper edge of the housing, and further comprising an exhaust hood positioned at the exit end of the heat shield for directing exhaust gases away from the converter assembly.

25. The apparatus of claim 24, further comprising a mounting bracket for mounting the housing enclosing the fan and converter assembly to a surface, and wherein the hood is hinged to an exterior surface for providing access to a cavity defined by walls of the heat shield.

26. A wall-mountable thermophotovoltaic generator apparatus comprising a thermophotovoltaic converter assembly, a fan positioned for generating an updraft from beneath the assembly, a housing for enclosing the fan and the assembly, a mounting bracket connectable to the housing for mounting the housing including the fan and converter assembly to a wall, and an exhaust hood hingedly connected to the wall and extending above a top end of the heat shield, wherein the assembly comprises a fuel source, a fuel/air combustion chamber connected to the fuel source for allowing hydrocarbon combustion, an infrared emitter positioned in the combustion chamber for emitting infrared radiation when heated by combustion gases resulting from the hydrocarbon combustion in the combustion chamber, a thermophotovoltaic cell circuit receiver positioned around the infrared emitter for receiving the infrared radiation and for converting the radiation to electric power, and a heat shield positioned between the receiver and the infrared emitter for preventing exhaust gases from contacting the receiver, wherein the receiver is electrically connected to the fan for providing at least a portion of the generated electric power to the fan.

27. A thermophotovoltaic generator apparatus comprising a thermophotovoltaic converter assembly, a remote fuel source connected to the assembly by a fuel line, a fan positioned for generating an updraft from beneath the assembly, and a housing for enclosing the fan and the assembly, wherein the assembly comprises a fuel/air combustion chamber connected to the fuel source by the fuel line for allowing hydrocarbon combustion, an infrared emitter positioned in the combustion chamber for emitting infrared radiation when heated by combustion gases resulting from the hydrocarbon combustion in the combustion chamber, a receiver positioned around the infrared emitter for receiving the infrared radiation and for converting the radiation to electric power, and a heat shield positioned between the receiver and the infrared emitter for preventing exhaust gases from contacting the receiver.

28. The apparatus of claim 27, further comprising a mounting bracket connected to the housing for mounting the housing, fan and assembly on a wall.

29. The apparatus of claim 27, wherein the heat shield comprises an exit end which extends beyond an upper edge of the housing, and further comprising an exhaust hood positioned at the exit end of the heat shield for directing exhaust gases away from the converter assembly.

30. The apparatus of claim 29, further comprising a mounting bracket for mounting the housing enclosing the fan and converter assembly to a surface, and wherein the hood is hinged to an exterior surface for providing access to a cavity defined by walls of the heat shield.

31. The apparatus of claim 30, further comprising a plate connected to the exhaust hood and the mounting bracket for mounting the housing, assembly, fan, exhaust hood and mounting bracket as a single unit on a surface.

32. The apparatus of claim 27, wherein the receiver further comprises a circuit having an inner surface facing the emitter and an outer surface, thermophotovoltaic cells connected to the inner surface of the circuit, and heat sinks connected to the outer surface of the circuit, and wherein the heat sinks further comprise radial fins extending from the outer surface of the circuit.

33. The apparatus of claim 27, wherein the fuel source further comprises a hydrocarbon fuel source selected from the group consisting of a natural gas fuel source and a propane gas fuel source.

34. The apparatus of claim 27, further comprising a valve positioned at a junction of the fuel line with the combustion chamber for regulating the flow of fuel into the mixing tube.

35. The apparatus of claim 27, wherein the infrared emitter is perforated.

36. The apparatus of claim 27, wherein the heat shield is a fused silica heat shield that is transparent to infrared energy.

37. The apparatus of claim 27, wherein the combustion chamber further comprises a fuel/air mixing tube having a lower end for receiving fuel from the fuel line and an upper end for housing combustion.

38. The apparatus of claim 37, wherein the mixing tube further comprises a cylindrical body having combustion air inlet holes.

39. The apparatus of claim 38, wherein the tube further comprises a combustion region positioned at a top end of the cylindrical body, and wherein the combustion region is defined by side walls of the emitter and ceramic top and bottom discs extending between the emitter side walls.

40. The apparatus of claim 27, further comprising an infrared selective filter positioned between the heat shield and the receiver.

41. The apparatus of claim 27, further comprising an electric conduit extending between the receiver and the fan for carrying wires routing at least a portion of the generated electric power from the receiver to the fan.

42. The apparatus of claim 41, wherein generated electric power is further routed via the electric conduit to an electric power outlet.

43. The apparatus of claim 41, wherein the electric conduit further comprises a slip connector for facilitating disconnect and reconnect of electrical connections extending between the receiver and the fan.

44. The apparatus of claim 27, wherein the heat shield comprises an exit end which extends beyond an upper edge of the housing, and further comprising an exhaust hood positioned at the exit end of the heat shield for directing exhaust gases away from the converter assembly.

45. A thermophotovoltaic generator method comprising providing a thermophotovoltaic converter assembly comprising a combustion chamber, an emitter positioned in the combustion chamber, a receiver positioned around the emitter and a heat shield positioned between the emitter and the receiver, combusting a fuel/air mixture in the combustion chamber, positioning a housing around the assembly such that the housing encloses at least substantially all of the assembly, heating the emitter using combustion gases resulting from combustion of the fuel/air mixture to produce infrared energy, collecting the infrared energy in the receiver, converting the infrared energy to electric power and creating an updraft flow from beneath the assembly for cooling the receiver and for providing an increased combustion air flow.

46. The method of claim 45, further comprising routing generated electric power from the receiver to the fan for powering the fan.

47. The method of claim 45, further comprising providing a fuel source in the housing directly beneath the assembly.

48. The method of claim 45, further comprising directing exhaust gases from the combustion chamber up through the heat shield and away from the assembly.

49. The method of claim 45, further comprising mounting the housing including the assembly and any updraft mechanisms on a wall.

* * * * *